(12) United States Patent
Bentley et al.

(10) Patent No.: US 9,299,775 B2
(45) Date of Patent: Mar. 29, 2016

(54) METHODS FOR THE PRODUCTION OF INTEGRATED CIRCUITS COMPRISING EPITAXIALLY GROWN REPLACEMENT STRUCTURES

(71) Applicant: GLOBALFOUNDRIES, Inc., Grand Cayman, KY (US)

(72) Inventors: Steven Bentley, Watervliet, NY (US); Kejia Wang, Poughkeepsie, NY (US); Sylvie Mignot, Albany, NY (US); Shurong Liang, Poughkeepsie, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 37 days.

(21) Appl. No.: 14/254,866

(22) Filed: Apr. 16, 2014

(65) Prior Publication Data
US 2015/0303249 A1 Oct. 22, 2015

(51) Int. Cl.
| H01L 21/76 | (2006.01) |
| H01L 29/06 | (2006.01) |
| H01L 29/66 | (2006.01) |
| H01L 21/762 | (2006.01) |
| H01L 29/78 | (2006.01) |
| H01L 21/02 | (2006.01) |

(52) U.S. Cl.
CPC ...... *H01L 29/0649* (2013.01); *H01L 21/02057* (2013.01); *H01L 21/76224* (2013.01); *H01L 29/66545* (2013.01); *H01L 29/66795* (2013.01); *H01L 29/785* (2013.01)

(58) Field of Classification Search
None
See application file for complete search history.

(56) References Cited

U.S. PATENT DOCUMENTS

| 8,802,537 | B1 * | 8/2014 | Wu | H01L 21/76224 438/221 |
| 2014/0374838 | A1 * | 12/2014 | Chen et al. | 257/401 |

* cited by examiner

*Primary Examiner* — Sonya D McCall Shepard
(74) *Attorney, Agent, or Firm* — Ingrassia Fisher & Lorenz, P.C.

(57) ABSTRACT

Integrated circuits and methods for producing such integrated circuits are provided. A method for producing the integrated circuit includes forming dummy structures in a substrate, and forming shallow trench isolation regions between the dummy structures where the shallow trench isolation regions includes a liner overlying a core. The dummy structures are etched to expose structure bases, and the structure bases are pre-cleaned. Replacement structures are epitaxially grown over the structure bases.

19 Claims, 7 Drawing Sheets

METHODS FOR THE PRODUCTION OF INTEGRATED CIRCUITS COMPRISING EPITAXIALLY GROWN REPLACEMENT STRUCTURES

TECHNICAL FIELD

The technical field generally relates to integrated circuits and methods for producing integrated circuits, and more particularly relates to integrated circuits with epitaxially grown replacement structures, and methods for producing such integrated circuits.

BACKGROUND

Transistors, such as metal oxide semiconductor field effect transistors (MOSFETs) or simply field effect transistors (FETs), are the core building blocks of the vast majority of semiconductor integrated circuits (ICs). A FET includes source and drain regions between which a current can flow through a channel under the influence of a bias applied to a gate electrode that overlies the channel. A fin field effect transistor (FinFET) is a type of transistor that lends itself to the dual goals of reducing transistor size while maintaining transistor performance. The FinFET is a three dimensional transistor formed with a thin fin that extends upwardly from a semiconductor substrate. In a FinFET, the transistor channel is formed along the vertical sidewalls of the fin, so a wide channel, and hence a very efficient layout, can be achieved without substantially increasing the area of the substrate surface required by the transistor.

Traditional FinFETs are produced from monocrystalline silicon. However, transistor performance or functionality can be significantly increased by forming fins from other materials, such as silicon-germanium (SiGe), germanium, or from compounds including elements from Groups III and/or V of the Periodic Table, (sometimes referred to as "III-V materials," "3-5 materials," or "III/V fins"). Such materials provide higher carrier velocity and higher drive currents at a given bias than comparable silicon materials. These materials may also enable additional functionality as a result of the materials properties, such as the presence of a direct bandgap. These other materials can be epitaxially grown from a base silicon crystal, but the presence of silicon oxide on the surface of the silicon crystal interferes with the epitaxial growth. Silicon oxide forms rapidly when silicon is exposed to the atmosphere, so a precleaning process is used to eliminate silicon oxide before epitaxially growth.

Epitaxially grown replacement fins have been produced by forming shallow trench isolation regions between "dummy" fins, removing the "dummy" fins to leave a void between the shallow trench isolation regions, and epitaxially growing the replacement fin in the void. Traditionally, the shallow trench isolation regions are primarily formed of silicon oxide. The dimensions of the void and the replacement fin, especially the width between adjacent shallow trench isolation regions, are important in determining the electrical properties of the final FinFET. However, the precleaning process that removes silicon oxide from the crystalline silicon also removes silicon oxide from the shallow trench isolation regions. The removal of silicon oxide increases the dimensions of the void where the replacement fin will be grown, so the dimensions of the replacement fin are larger than the designed dimensions based on the size and location of the shallow trench isolation regions. Silicon oxide may also be removed at varying rates in the precleaning process, which further complicates matters, because the dimension of the resulting fins vary from one fin to the next.

Accordingly, it is desirable to provide a replacement fin with dimensions that match the size and shape of the void produced by adjacent shallow trench isolation regions, and methods for producing the same. In addition, it is desirable to provide other replacement structures, such as components of planar FETs or interconnects, with consistently sized shallow trench isolation regions and methods for producing such replacement structures. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods for producing the same are provided. In an exemplary embodiment, a method for producing an integrated circuit includes forming dummy structures in a substrate, and forming shallow trench isolation regions between the dummy structures where the shallow trench isolation regions include a liner overlying a core. The dummy structures are etched to expose structure bases, and the structure bases are precleaned. Replacement structures are epitaxially grown over the structure bases.

In another embodiment, a method is provided for producing an integrated circuit. Shallow trench isolation regions are formed overlying a substrate, and a void is formed over a structure base between adjacent shallow trench isolation regions. The structure base, which includes substrate material, is precleaned such that a void width changes by 5% or less during the precleaning. A replacement structure is epitaxially grown in the void.

An integrated circuit is provided in another embodiment. The integrated circuit includes a plurality of replacement fins overlying a substrate. A shallow trench isolation region is positioned between adjacent replacement fins, and the shallow trench isolation region includes a liner and core with the liner positioned between the core and the adjacent replacement fins.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

The various embodiments of the integrated circuits described herein include replacement structures positioned between adjacent shallow trench isolation regions. In some embodiments, the replacement structures are replacement fins, but in other embodiments the replacement structures are structures other than fins, including but not limited to larger areas of material that are later formed into multiple devices or interconnects. In many embodiments, the replacement structures include elements other than silicon at concentrations higher than typical dopant concentrations. The replacement structures may include silicon germanium, germanium, III-V materials, or other compounds, so the interatomic crystalline distance in the replacement structure may be different than monocrystalline silicon. The replacement structures may also include dopants in some embodiments. The process begins by forming dummy structures in a substrate. Shallow trench isolation regions are formed between the dummy structures, where the shallow trench isolation regions include a silicon oxide core, and the dummy structures are removed to form a void and expose a structure base. The structure base is precleaned to remove silicon oxide and other contaminants, and the rest of the integrated circuit is exposed to the precleaning process. The silicon oxide in the shallow trench isolation region core is susceptible to attack during the precleaning process, so the core is protected by a protective liner that is not rapidly etched by the precleaning process. The liner is formed over the core prior to precleaning, and in some embodiments the liner is formed around the core. When the protective liner is formed over the core, it also forms over the dummy structures, so a cap is used to protect the liner overlying the core while the liner is removed from over the dummy structures. The dummy structures are etched to expose structure bases, and the replacement structures are epitaxially grown from those structure bases. The protective liner may be removed from over the shallow trench isolation region after the replacement structure is grown, and the replacement structure is then available for the production of FinFETS, planar FETS, or other components of an integrated circuit.

Figure 1:
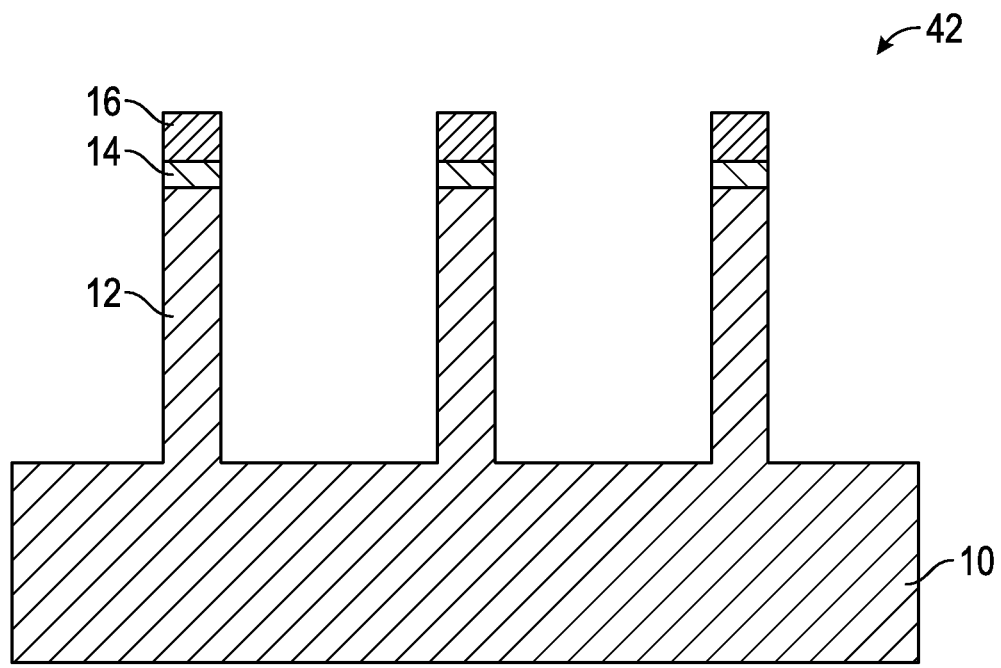
FIGS. 1-13 illustrate, in cross sectional views, a portion of an integrated circuit and methods for its fabrication in accordance with exemplary embodiments.

Reference is now made to the exemplary embodiment illustrated in FIG. 1. Dummy structures 12 are formed in a substrate 10, where the substrate 10 comprises a semiconductor. As used herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In many embodiments, the semiconductor material is a crystalline silicon substrate. The silicon substrate may be a bulk silicon wafer (as illustrated) or may be a thin layer of silicon on an insulating layer (commonly known as silicon-on-insulator or SOI) that, in turn, is supported by a carrier wafer.

Dummy structures 12 are formed in the substrate, such as with an etch mask 14 and photoresist layer 16. The figures in this description illustrate exemplary embodiments where the replacement structure is a fin, but this description is also applicable to other types of structures, such as planar devices or interconnects, so this description includes structures other than fins. In an exemplary embodiment, a silicon nitride etch mask 14 is deposited overlying the substrate 10, such as by reacting ammonia and dichlorosilane in a low pressure chemical vapor deposition furnace. As used herein, the term "overlying" means "over" such that an intervening layer may lie between the etch mask 14 and the substrate 10, and "on" such the etch mask 14 may physically contact the substrate 10. The photoresist layer 16 may be deposited over the etch mask 14 by spin coating, and patterned by exposure to light or other electromagnetic radiation through a mask with transparent sections and opaque sections. The light causes a chemical change in the photoresist such that either the exposed portion or the non-exposed portion can be selectively removed. The desired locations are removed with an organic solvent, and the photoresist layer 16 remains overlying selected areas of the etch mask 14. The etch mask 14 is removed from areas where the photoresist layer 16 was removed, such as by etching with hot phosphoric acid. The remaining photoresist layer 16 may then be removed, such as with an oxygen containing plasma, and the substrate 10 is anisotropically etched using a reactive ion etch with hydrofluoric acid in an exemplary embodiment. The etch mask 14 is then removed, such as with a wet etch using hot phosphoric acid. The dummy structures 12 can be formed in other manners as well.

Figure 2:
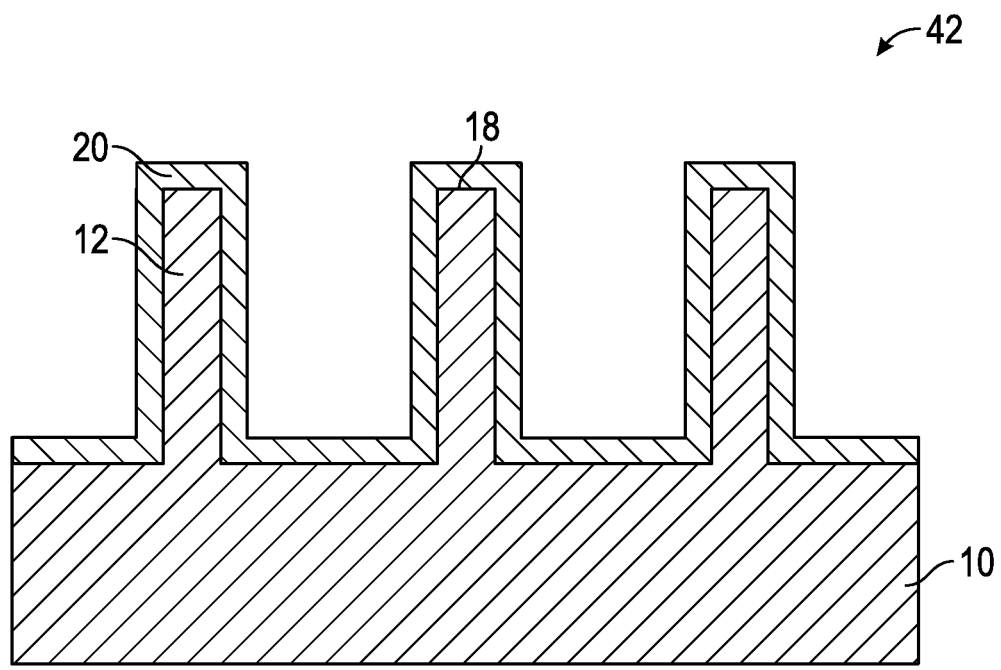

In some embodiments, a liner 20 is conformally deposited overlying the dummy structures 12 and the substrate 10, as illustrated in an exemplary embodiment in FIG. 2. The liner 20 is formed from a liner material, where the liner material has a slow etch rate relative to a precleaning process described below. In an exemplary embodiment, the liner material is silicon nitride that may be deposited by atomic layer deposition using ammonia with dichlorosilane. Several other liner materials can be used in other embodiments, such as aluminum oxide, titanium oxide, boro-silicate glass, or other materials. The type of liner material may be selected based on the precleaning process selected, as described below. In an alternate embodiment, no liner material is deposited at this point in the process.

Figure 3:
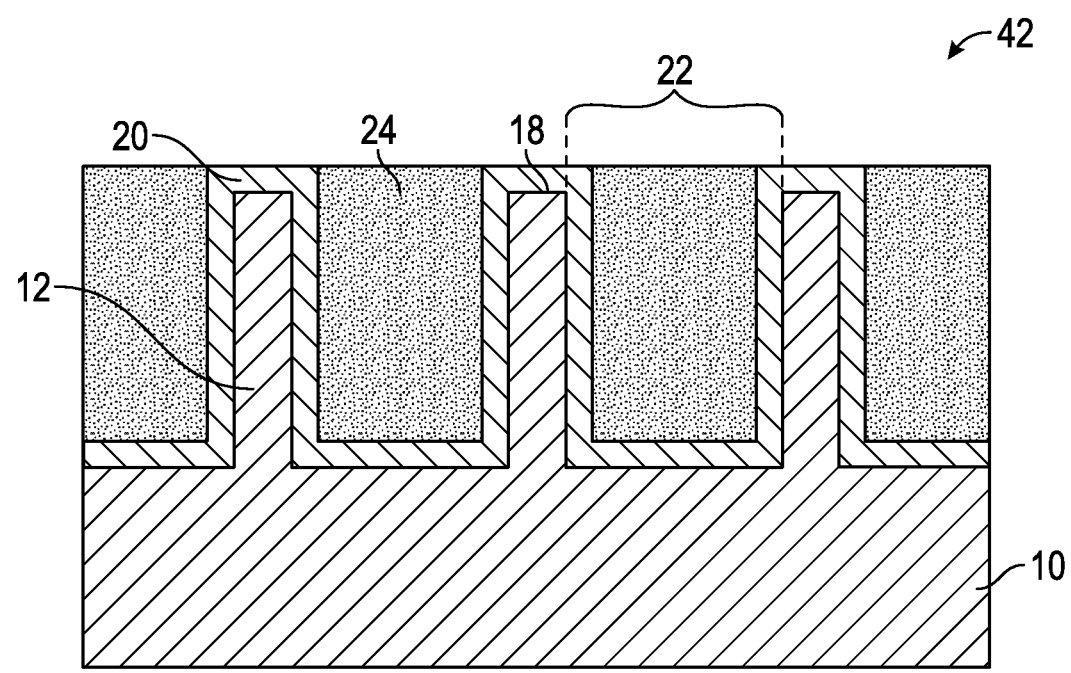
Figure 4:
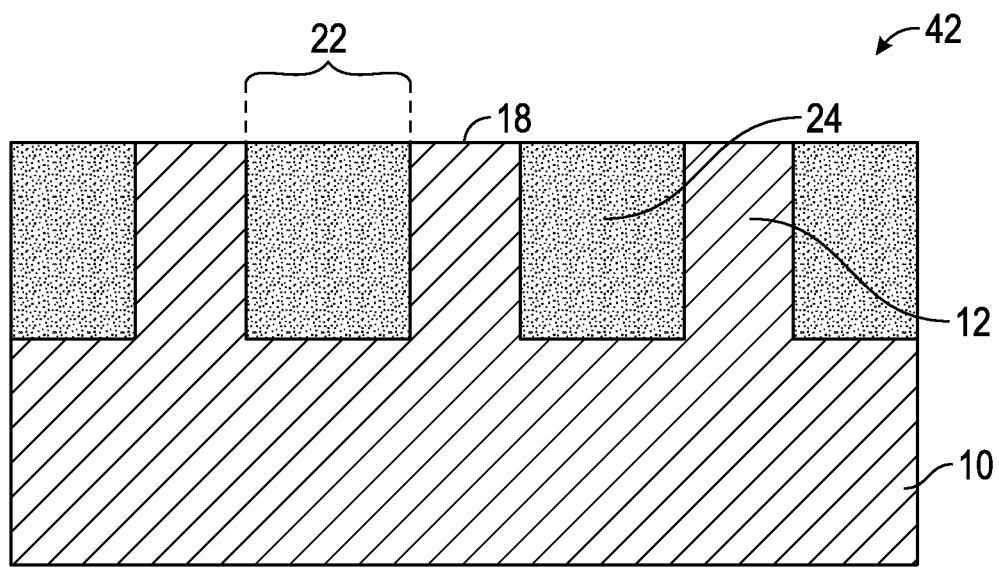

Referring to FIG. 3, a plurality of shallow trench isolation regions 22 are formed by depositing a core 24 overlying the liner 20 between adjacent dummy structures 12, where the shallow trench isolation region 22 includes the core 24 and the liner 20. In an exemplary embodiment, the core 24 is silicon oxide, which may be deposited by chemical vapor deposition using silane and oxygen, and the core 24 is annealed in some embodiments. In the illustrated embodiment, the liner 20 is positioned between the core 24 and the dummy structure 12, as well as between the core 24 and the underlying substrate 10. The material of the core 24 may extend over the top of the dummy structures 12 when deposited. However, the surface may be smoothed, such as with chemical mechanical planarization, so the liner 20 (if present) overlying the dummy structures 12 is exposed. In an alternative embodiment illustrated in FIG. 4, no liner material is used prior to forming the core 24, and thus no liner material is positioned between the core 24 and dummy structures 12. In the embodiment illustrated in FIG. 4, the upper surface of the dummy structures 12 is exposed by chemical mechanical planarization, because no liner material is present.

Figure 5:
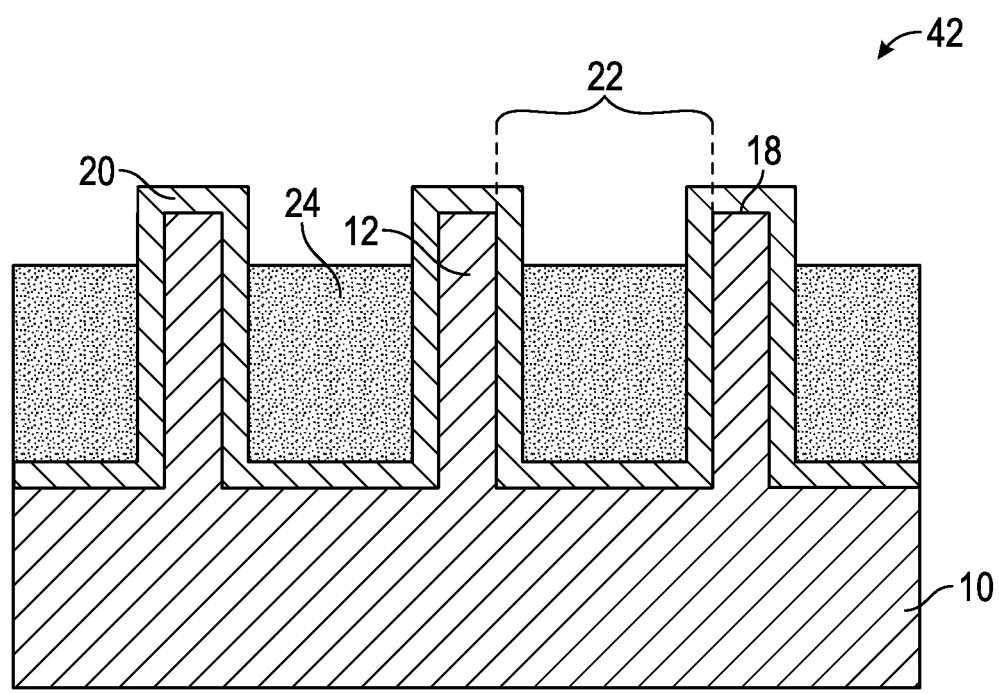

A portion of the core 24 between adjacent dummy structures 12 is removed in an exemplary embodiment illustrated in FIG. 5. The core 24 is recessed with an etchant selective to the material of the core 24 over the material of the liner 20 or dummy structure 12. In an exemplary embodiment with a silicon oxide core 24, a silicon nitride liner 20 and a monocrystalline silicon dummy structure 12, a dry etch using hydrogen, nitrogen trifluoride, and ammonia is used. Etchants selective to silicon oxide over crystalline silicon and silicon nitride are commercially available, such as the etchant marketed under the trademark SICONI by Applied Materials, Inc. A wet etch or other etchants could also be used. The core 24 is recessed by about 150 angstroms from a dummy structure upper surface 18 in some embodiments, and the depth that the core 24 is recessed is controlled by the period of time the core 24 is etched. In some embodiments, the liner 20 overlying the dummy structure 12 is optionally removed (not illustrated), such as with a hot phosphoric wet etch.

Figure 6:
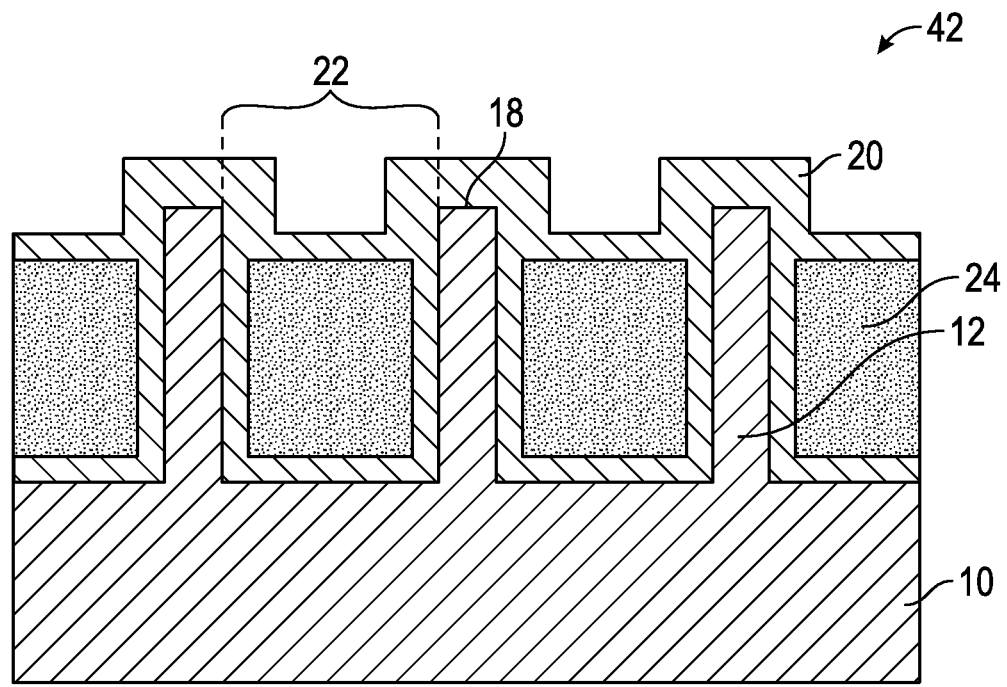
Figure 7:
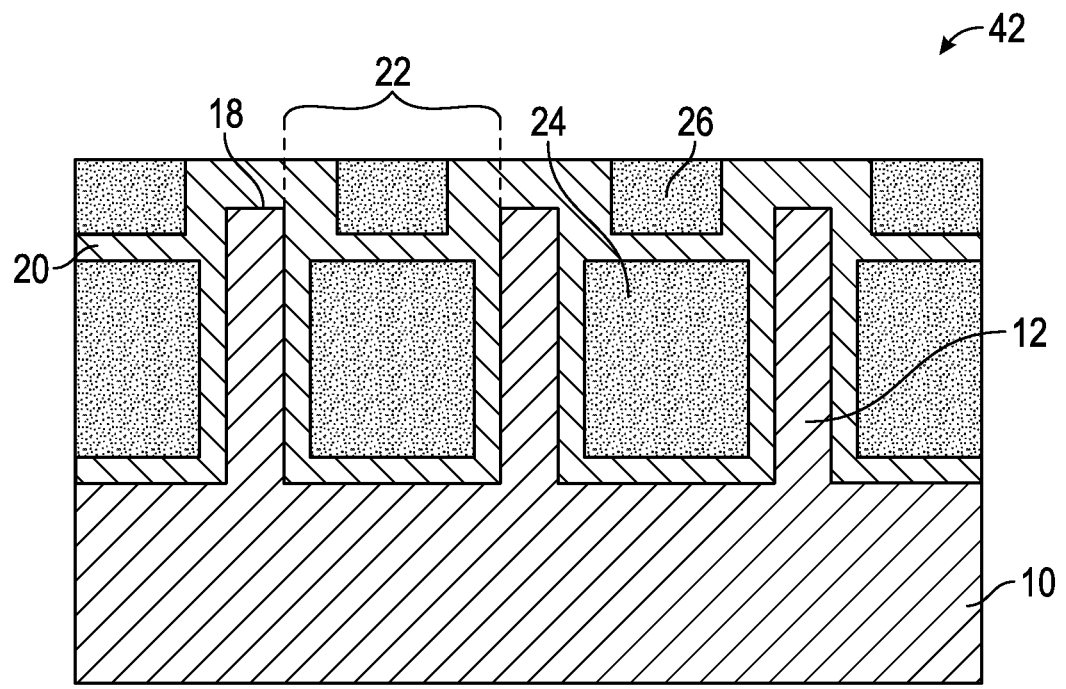

Referring to FIG. 6, additional liner material is conformally deposited overlying the integrated circuit 42. The addition of the liner material results in a thicker liner 20 over the dummy structure 12. In an exemplary embodiment, the additional liner material is the same as the material used to form the liner 20, such as silicon nitride, which may be conformally deposited in the same manner as described above. The recessed core 24 and the higher dummy structures 12 produce a crenulated liner surface over the dummy structures 12 and the core 24, with lower portions positioned over the core 24. A cap 26 is formed overlying the core 24 in the lower portions of the crenulated liner surface, as illustrated in FIG. 7. The cap 26 is a different material than the liner 20. In an exemplary embodiment, the cap 26 is silicon oxide, which may be deposited by chemical vapor deposition using silane and oxygen. When deposited, the material of the cap 26 may extend over the dummy structures 12 as well as the core 24 of the shallow trench isolation region 22. The overburden of the cap 26 overlying the dummy structures 12 can be removed by chemical mechanical planarization, which is stopped on the liner material overlying the dummy structures 12. In this regard, the cap 26 remains over the core 24 but not over the dummy structures 12.

Figure 8:
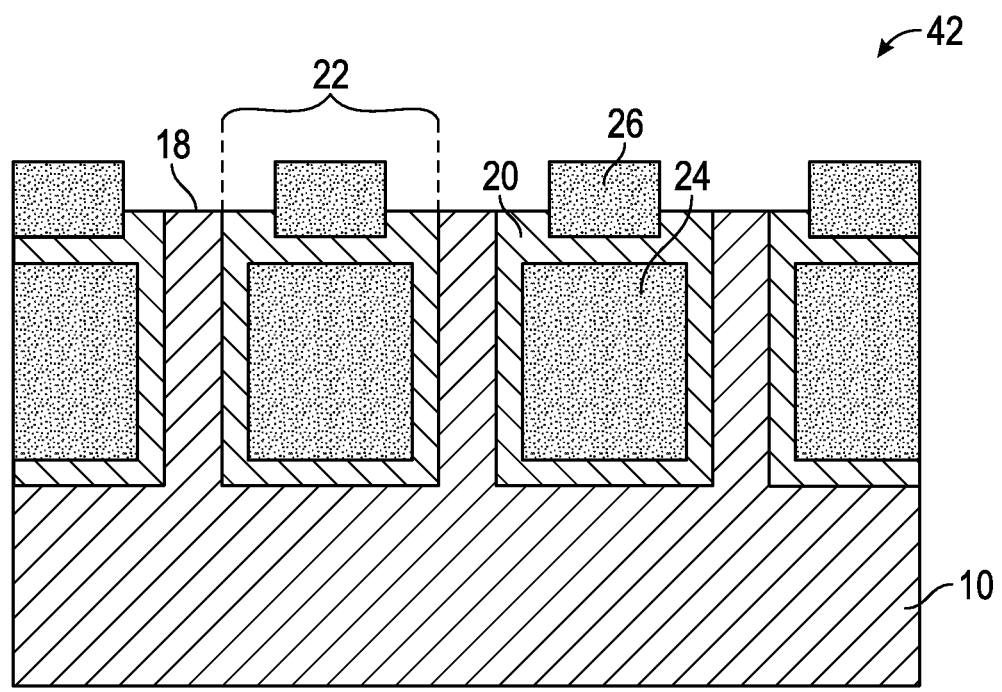

Referring to FIG. 8, liner material is selectively etched to expose the top surface of the dummy structures 12. An etchant is used that selectively etches the liner material over the material of the cap 26. A wet etch with hot phosphoric acid may be used in an exemplary embodiment with a silicon nitride liner material and a cap 26 of silicon oxide. The cap 26 protects the liner 20 overlying the core 24, and the etch is limited in time so the liner 20 positioned between the core 24 and the dummy structure 12 is not significantly etched. Therefore, the liner 20 remains over the core 24, beside the core 24, and underlying the core 24 in embodiments where the liner 20 is positioned between the core 24 and the dummy structure 12. In embodiments with no liner 20 between the core 24 and the dummy structure 12, the cap 26 still protects the liner 20 overlying the core 24, but the core 24 extends and contacts the side wall of the adjacent dummy structures 12.

Figure 9:
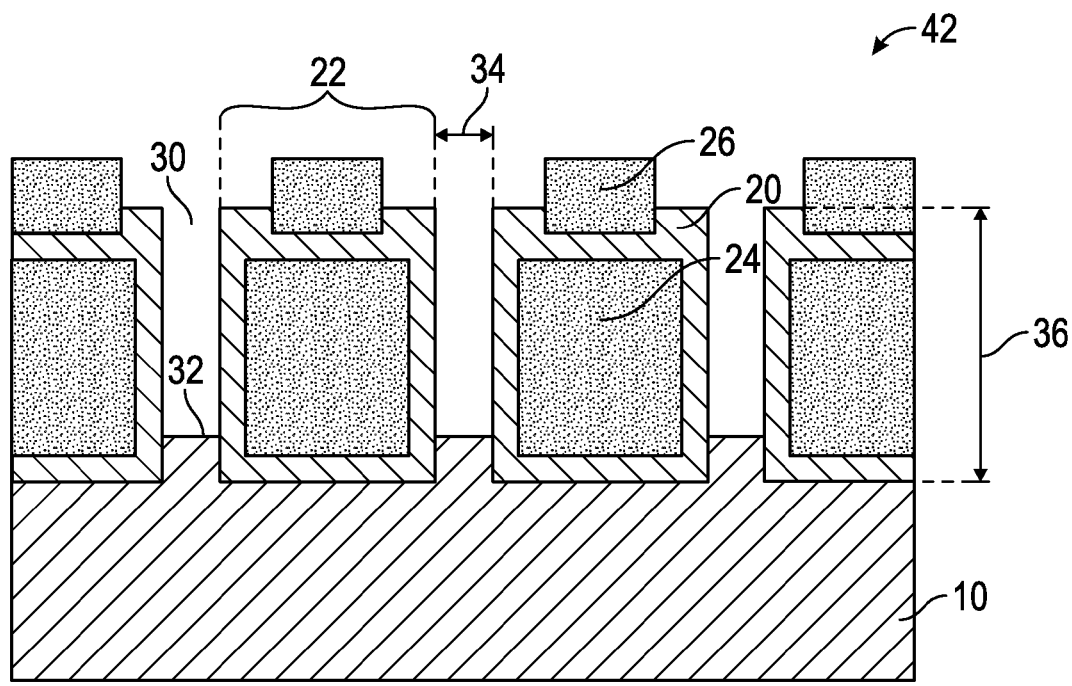

The dummy structures 12 are removed from between adjacent shallow trench isolation regions 22, as illustrated in FIG. 9 with continuing reference to FIG. 8. The dummy structures 12 may be removed with an anisotropic etchant selective to the material of the dummy structure 12 over the liner material and/or the material of the core 24. For example, a reactive ion etch in a fluorine chemistry or aqueous ammonium hydroxide chemistry may be used in embodiments with a monocrystalline silicon dummy structure 12, a silicon oxide core 24 and cap 26, and a silicon nitride liner 20. As is true for many process steps in integrated circuit manufacture, there are several different methods and chemistries for performing individual steps, and descriptions herein of one example are not intended to exclude other available options known to those skilled in the art. A void 30 is formed in the space previously occupied by the dummy structure 12, and the void 30 extends to a structure base 32 that is exposed by the etching of the dummy structure 12. The remaining structure base 32 may be along a side surface of the liner 20 (if present) and core 24, or the dummy structures 12 may be removed so the structure base 32 is on the same level as the bottom of the liner 20 (if present) or the core 24. The void 30 overlies the substrate 10 and is partially defined by the adjacent shallow trench isolation regions 22 such that a void width, illustrated by the double headed arrows labeled with reference number 34, extends across the void 30 from one adjacent shallow trench isolation region 22 to another. The shallow trench isolation region 22 also has a shallow trench isolation height 36 extending from the bottom to the top of the shallow trench isolation region 22, where the shallow trench height is indicated by the double headed arrows labeled with reference number 36. The structure base 32 may be exposed to oxygen in the air in some embodiments, such as during movement from one processing tool to another, and the oxygen exposure can form some silicon oxide overlying the structure base 32.

Figure 10:
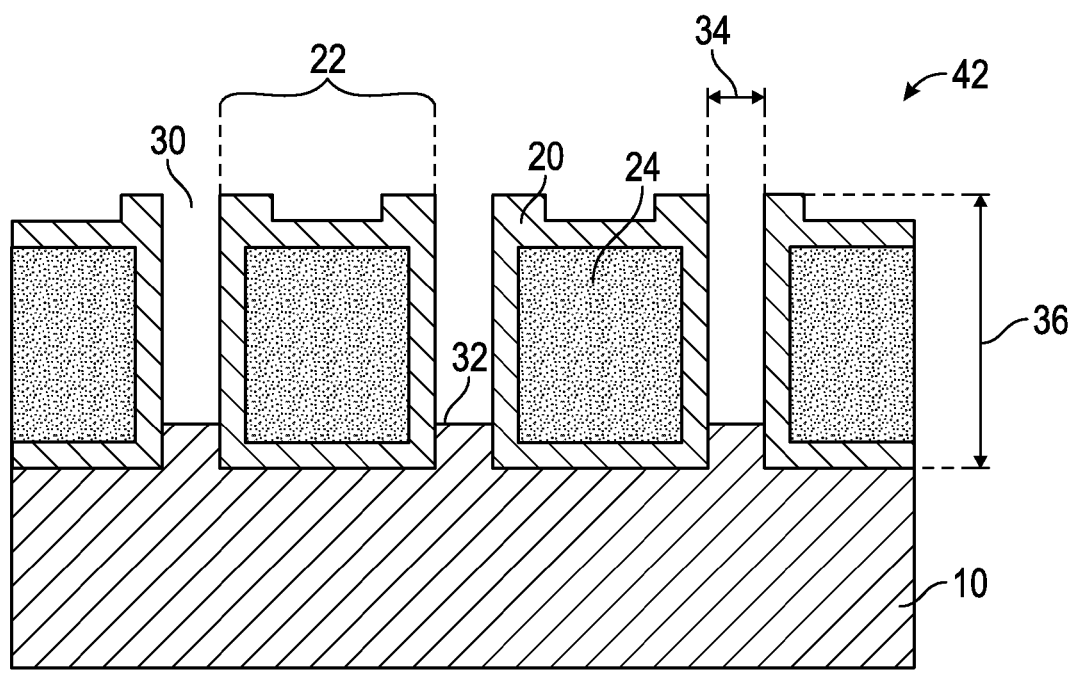

Referring to FIG. 10, the structure base 32 is precleaned in preparation for epitaxial growth. Small deposits of silicon oxide on the surface of the structure base 32 interfere with the epitaxial growth process. The precleaning process is a dry etch process that attacks exposed silicon oxide. In an exemplary embodiment, the precleaning process includes exposing the structure base 32 to an ionized reactive gas with nitrogen and fluorine atoms, such as a mixture of ammonia and nitrogen trifluoride, at a temperature of about 0 to about 50 degrees centigrade (° C.). The reactive gas reacts with the oxygen containing atom on the structure base 32, such as silicon oxide, to form a solid compound such as $((NH_4)_2SiF_6)$. In some embodiments, the structure base 32 is optionally annealed at a temperature of about 70° C. or more, where the solid compound sublimes to leave the structure base 32 essentially free of oxides. The structure base 32 is annealed after the substrate is in position in a chamber where the epitaxial growth will occur. Other precleaning processes known to those skilled in the art may also be used, as mentioned above. The liner 20 protects the core 24, so silicon oxide present in the core 24 is not attacked by the precleaning process. The liner material is selected to be compatible with the precleaning process, so it may not include oxide compounds at any significant concentration. Therefore, the shallow trench isolation region 22 is not etched or diminished to a significant degree during the precleaning process. For example, the void width 34 may not increase or change by 5% or more during the precleaning in some embodiments, the void width 34 may not change more than 10% during precleaning in other embodiments, and the void width 34 may not change more than 20% during precleaning in other embodiments. In a similar manner, during the precleaning process the shallow trench isolation height 36 may not decrease or change by more than 10% in some embodiments, the shallow trench isolation height 36 may not decrease or change by more than 20% is other embodiments, and the shallow trench isolation height 36 may not decrease or change by more than 30% in yet other embodiments.

Figure 11:
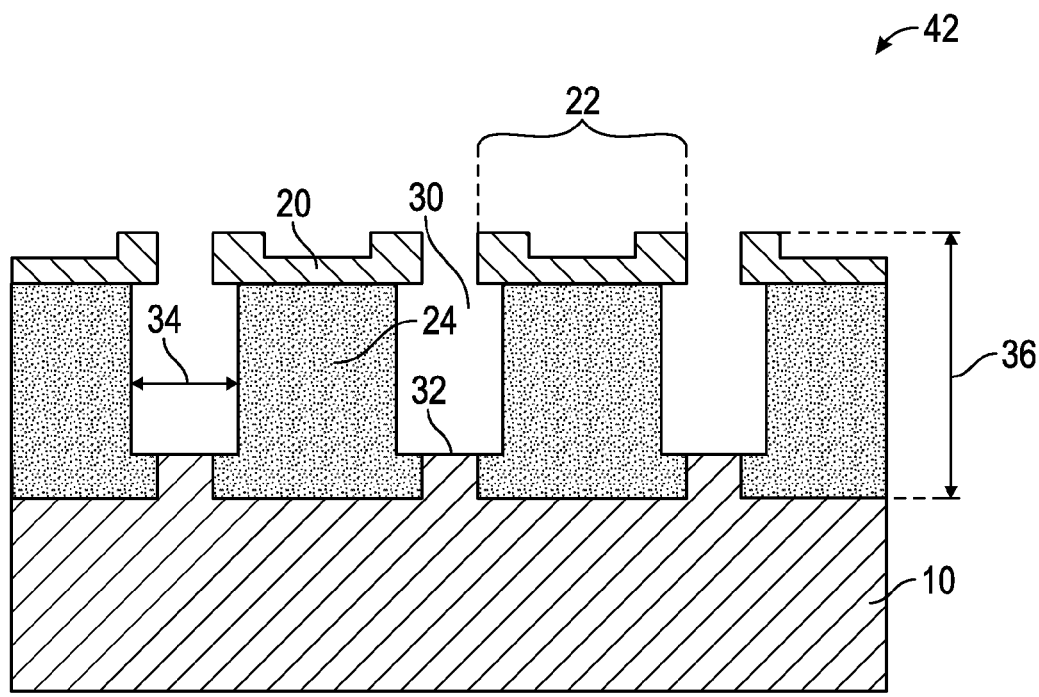

Referring to FIG. 11, the results of the precleaning process for an alternate embodiment are illustrated. In the exemplary embodiment illustrated in FIG. 11, the liner 20 was positioned over the core 24, but not between the core 24 and the dummy structure. Therefore, the side wall of the core 24 is exposed during the precleaning process. The precleaning process is performed anisotropically in the illustrated exemplary embodiment, so the liner 20 overlying the core 24 provides protection that minimizes losses of the material of the core 24 during the precleaning process. However, the side walls of the core 24 are etched to some degree, so the width of the void 30 does increase somewhat. In an exemplary embodiment, the width of the void 30 increases by about 10% to about 50% during the precleaning process in this embodiment. The liner 20 protects the top of the core 24, so the shallow trench isolation height 36 changes by about 10% or less during the precleaning process.

Figure 12:
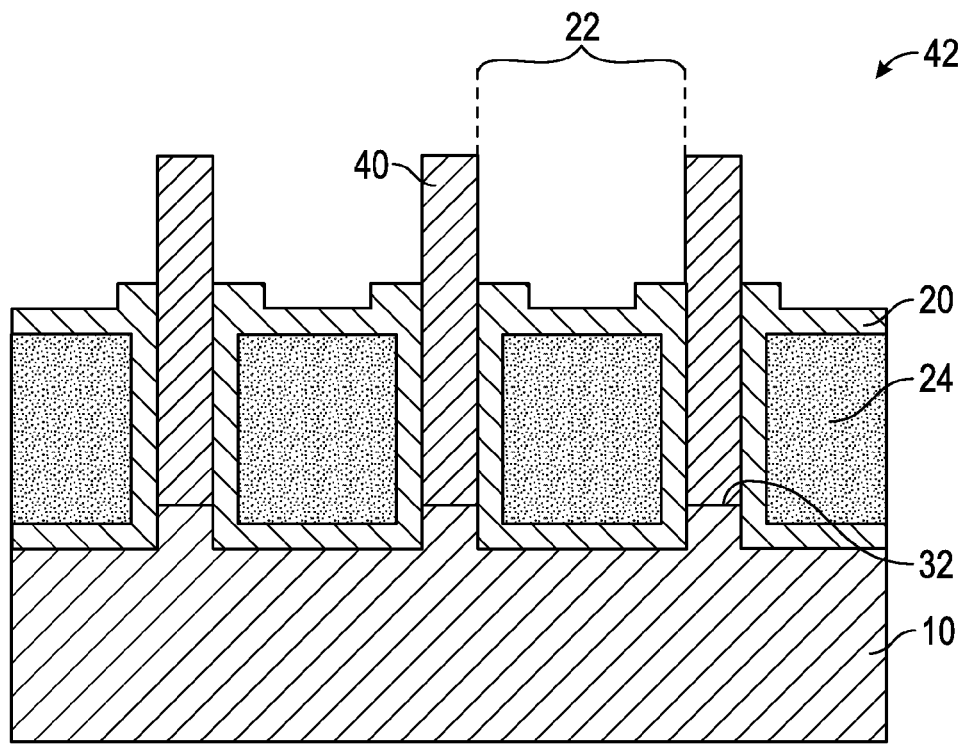

A replacement structure 40 is epitaxially grown in the void 30, as illustrated in an exemplary embodiment in FIG. 12, with continuing reference to FIG. 10. In embodiments with a III-V material, the replacement structure 40 includes an element from Group III and Group V of the Periodic Table, such as indium, gallium, and arsenide (InGaAs), or gallium antimonide (GaSb), or other groupings. Group III of the Periodic Table includes the elements boron (B), aluminum (Al), gallium (Ga), indium (In), and thallium (Tl), and Group V includes nitrogen (N), phosphorous (P), arsenic (As), antimony (Sb), and bismuth (Bi). In other embodiments, the replacement structure 40 includes elements from other Groups of the Periodic Table. The replacement structure 40 is epitaxially grown from the crystal structure of the structure base 32. There is a normal crystalline interatomic distance in silicon, with a normal lattice spacing of about 5.4 angstroms. Other elements have a different atomic size than silicon, and different normal lattice spacing based on that atomic size. The III-V compounds may therefore be selected such that the average lattice spacing, based on the different atomic sizes, is relatively close to silicon, or it may be larger. In one exemplary embodiment, a GaSb replacement structure 40 is grown by vacuum chemical epitaxy using triethyl gallium and triethyl antimony, but other types of epitaxy and other compounds can also be used, such as molecular beam epitaxy. Doping impurities of the desired type may be added to the source gas during the epitaxial growth, so the replacement structure 40 is formed with the desired dopant at the desired concentration. In some embodiments, the replacement structure 40 includes multiple layers, and the concentrations and/or compositions of one layer may or may not vary from another. Layers with different compositions can be formed by various techniques, such as successive epitaxial growth steps, or by ramping or varying the concentration of deposition compounds during the epitaxial growth process.

Figure 13:
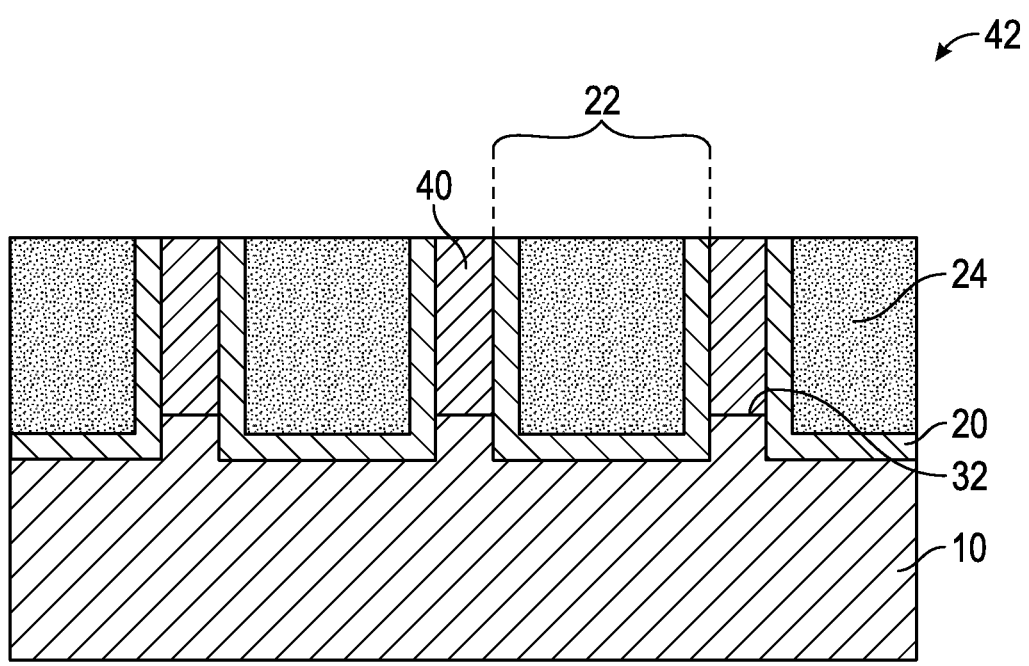

Reference is made to FIG. 13, with continuing reference to FIG. 12. An integrated circuit 42 can be manufactured with the replacement structures 40 using a wide variety of processes well known to those of skill in the art. In one embodiment, the top of the replacement structures 40 and the upper surface of the liner 20 are removed by chemical mechanical planarization to leave a flat surface. The shallow trench isolation regions 22 can then be recessed, or partially removed, to provide protruding fins for integrated circuit production. In an alternate embodiment (not illustrated), the upper surface of the liner 20 is selectively etched, leaving the replacement structures 40 extending over the shallow trench isolation regions 22 for integrated circuit production. In yet other embodiments, the replacement structure 40 is used for manufacture of planar FETs or other components of an integrated circuit 42. As such, the replacement structure 40 can be incorporated into an integrated circuit 42 using a wide variety of techniques and methods.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit comprising:
    forming dummy structures from a semiconductor substrate;
    forming shallow trench isolation regions between the dummy structures, wherein the shallow trench isolation regions comprise a core and a liner overlying the core;
    depositing a liner material overlaying the core such that the liner extends over the core;
    forming a cap overlying the liner and the core, wherein the cap comprises a different material than the liner;
    etching the dummy structures to expose structure bases after forming the cap;
    precleaning the structure bases; and
    epitaxially growing replacement structures overlying the structure bases.

2. The method of claim 1 wherein forming the shallow trench isolation regions further comprises forming the liner between the core and the dummy structures.

3. The method of claim 1 wherein epitaxially growing the replacement structures comprises epitaxially growing replacement fins, wherein the replacement fins comprise a compound from Group III of the Periodic Table.

4. The method of claim 1 wherein forming the shallow trench isolation regions further comprises forming the core comprising silicon oxide.

5. The method of claim 4 wherein forming the shallow trench isolation regions comprises forming the liner comprising silicon nitride.

6. The method of claim 1 wherein precleaning the structure bases comprises precleaning the structure bases such that a shallow trench isolation height changes by 10 percent or less during precleaning.

7. The method of claim 1 further comprising:
    removing the cap after etching the dummy structures.

8. The method of claim 7 wherein;
    epitaxially growing replacement structures comprises epitaxially growing replacement structures after removing the cap.

9. The method of claim 1 wherein forming the shallow trench isolation regions comprises:
    depositing a liner material overlying the dummy structures and the semiconductor substrate prior to forming the shallow trench isolation regions;
    depositing the core between adjacent dummy structures and overlying the liner material; and
    depositing additional liner material overlying the core.

10. The method of claim 1 wherein etching the dummy structures comprises forming a void between adjacent shallow trench isolation regions, wherein the void comprises a void width; and
    wherein precleaning the structure bases comprises precleaning the structure bases such that the void width changes by 5% or less during precleaning.

11. The method of claim 1 wherein epitaxially growing the replacement structures further comprises epitaxially growing the replacement structures wherein the replacement structures comprises a compound from Group V of the Periodic Table.

12. The method of claim 1 wherein forming the shallow trench isolation regions comprises;
    conformally depositing a liner material overlying the dummy structures, wherein the liner material comprises silicon nitride;
    depositing the core overlying the liner material, wherein the core comprises silicon oxide; and
    conformally depositing the liner material overlying the core.

13. A method of producing an integrated circuit comprising:
    forming shallow trench isolation regions overlying a substrate, wherein the substrate comprises a substrate material, and wherein the shallow trench isolation regions comprise a shallow trench isolation height;

forming a void between adjacent shallow trench isolation regions such that the void overlies a structure base, wherein the structure base comprises the substrate material, and wherein the void has a void width;

precleaning the structure base, wherein the void width increases by about 10% to about 50% during precleaning, and wherein the shallow trench isolation height changes by about 10% or less; and epitaxially growing a replacement structure in the void.

14. The method of claim 13 wherein forming the shallow trench isolation regions comprises;

forming dummy structures overlying the substrate; and forming the shallow trench isolation regions between adjacent dummy structures.

15. The method of claim 14 wherein forming the shallow trench isolation regions comprises forming the shallow trench isolation regions comprising a core and a liner, wherein the liner overlies the core.

16. The method of claim 14 wherein forming the void between the adjacent shallow trench isolation regions comprises etching the dummy structures to expose the structure base.

17. The method of claim 13 wherein epitaxially growing the replacement structure comprises epitaxially growing a replacement fin comprising a compound from Group V of the Periodic Table.

18. The method of claim 13 wherein forming the void comprises exposing a slide wall of a core of the shallow trench isolation regions.

19. The method of claim 14 wherein forming the shallow trench isolation regions comprises forming the shallow trench isolation regions with a core wherein the core directly contacts the dummy structures at a side wall of the core.

* * * * *